United States Patent [19]

Smith et al.

[11] Patent Number: 4,571,581

[45] Date of Patent: Feb. 18, 1986

[54] APPARATUS AND METHOD FOR PRODUCTION LINE LEAKAGE TESTING OF MICROWAVE OVEN CAVITIES

[75] Inventors: Peter H. Smith, Anchorage; Raymond L. Dills, Louisville, both of Ky.

[73] Assignee: General Electric Company, Louisville, Ky.

[21] Appl. No.: 586,507

[22] Filed: Mar. 5, 1984

[51] Int. Cl.⁴ .............................................. G08B 17/12
[52] U.S. Cl. ...................... 340/600; 324/95; 219/10.55 D
[58] Field of Search ................. 340/600; 219/10.55 R, 219/10.55 M, 10.55 D; 324/95; 250/250

[56] References Cited

U.S. PATENT DOCUMENTS

| | | | |
|---|---|---|---|
| 3,422,242 | 1/1969 | Miyata | 219/10.55 |
| 3,810,005 | 5/1974 | Bennion et al. | 324/58.5 A |
| 3,819,899 | 6/1974 | Wallin et al. | 219/10.55 |
| 3,974,353 | 8/1976 | Goltsos | 219/10.55 A |
| 4,199,716 | 4/1980 | Reindel | 340/600 |
| 4,313,044 | 1/1982 | Staats | 219/10.55 |
| 4,338,595 | 7/1982 | Newman | 340/600 |
| 4,354,153 | 10/1982 | Lentz | 324/95 |
| 4,467,278 | 8/1984 | Toth et al. | 340/600 |

FOREIGN PATENT DOCUMENTS 621960 6/1961 Canada .

Primary Examiner—James L. Rowland
Assistant Examiner—Jeffery A. Hofsass
Attorney, Agent, or Firm—H. Neil Houser; Radford M. Reams

[57] ABSTRACT

Method and apparatus for testing microwave oven cavities during the oven fabrication process after the cavity forming operation is complete. The cavity to be tested is positioned front frame resting on a test plate containing a non-protruding microwave power source and choke/ferrite attenuators. The power source radiates into the interior of the cavity and microwave leakage is measured at the cavity exterior.

17 Claims, 11 Drawing Figures

APPARATUS AND METHOD FOR PRODUCTION LINE LEAKAGE TESTING OF MICROWAVE OVEN CAVITIES

BACKGROUND OF THE INVENTION

This invention relates generally to apparatus and methods for the production line testing of microwave oven cavities for microwave leakage.

Microwave oven cavities are typically fabricated from sheet metal formed to define a cavity enclosure and its accompanying microwave launcher section for housing the magnetron probe and waveguide section for coupling microwave energy from the launcher section to the interior of the cavity. Sheet metal joints are formed during fabrication by spot or projection welding or metal crimping techniques. A substantial number of such joints are typically formed in the fabrication process. A faulty joint may result in a flaw in the cavity which permits microwave leakage to the exterior of the cavity in excess of acceptable limits. Common practice today is to check the oven for leakage after manufacturing has been completed. At this stage the cavity has received several coats of paint, the door has been attached, all the components of the oven have been installed, and the outer oven housing and decorative trim has been applied. In the event a leak is detected at this stage the entire oven has to be torn down to allow manual correction of a faulty joint. To correct a weld, paint needs to be removed from the area of the defective weld of the cavity. Repainting is required once the correction has been made. All of these factors result in a lower production efficiency and increased production costs.

In view of the costs and loss of time associated with the repair of a defective joint detected after the completion of the oven assembly process, it would be desirable to provide a method and apparatus for testing the integrity of the cavity after the cavity and joint forming operations are complete but prior to the paint spray operation and subsequent oven fabrication steps.

It is therefore a primary object of the present invention to provide apparatus for accurately and rapidly performing leakage testing on oven cavities at that stage of the production line after the cavity and joint forming steps and before the subsequent fabrication steps.

It is a further object of the present invention to provide apparatus for exciting the cavity by a power source effectively internal to the cavity and monitoring radiation external of the cavity prior to mounting of the door and further assembly of the oven.

SUMMARY OF THE INVENTION

In accordance with one aspect of the invention there is provided apparatus for production line microwave leakage testing of the microwave oven cavity of the type having one wall defining an access opening into the cavity. A generally planar conductive test plate defines on one surface thereof a test position for supporting a microwave oven cavity to be leakage tested. An aperture is formed in the plate such that the cavity when positioned in its test position with the access opening defining wall in microwave sealing engagement with said plate, the access opening overlays the aperture. A means for generating microwave energy is provided together with means for coupling microwave energy from said generating means into the interior of the cooking cavity through the plate aperture and the cavity access opening. An enclosure comprising conductive walls, shieldably encloses the cavity when the cavity is positioned in its test position. Microwave leakage detection means are strategically disposed in the enclosure to detect power density of the microwave leakage from the cavity into the region between the cavity and the enclosure walls. Signal means responsive to the detection means generates a user discernable signal upon detection of leakage microwave power density greater than a predetermined reference level thereby alerting the user to the presence of a flaw in the cavity permitting microwave leakage in excess of an acceptable level.

In accordance with a further aspect of the present invention a display means in the form of a printer provides a hard copy display to the user showing the detected radiation level associated with each of a plurality of the power density measuring devices. This hard copy enables the user to determine which device is likely the closest to the location of the flaw permitting the leakage. In accordance with yet another aspect of the present invention power control means are provided for varying the output power of the microwave generating means over a range of discrete power levels beginning at the minimum power level and increasing in step-wise fashion to the maximum output level. Printing means provides a hard copy display of the detected leakage level for each measuring device at the various power levels.

A more through understanding of the invention along with a better appreciation of the objects and novel features thereof is provided by the following detailed description taken in conjunction with the accompanying drawings.

DETAILED DESCRIPTION OF THE INVENTION

Figure 1:
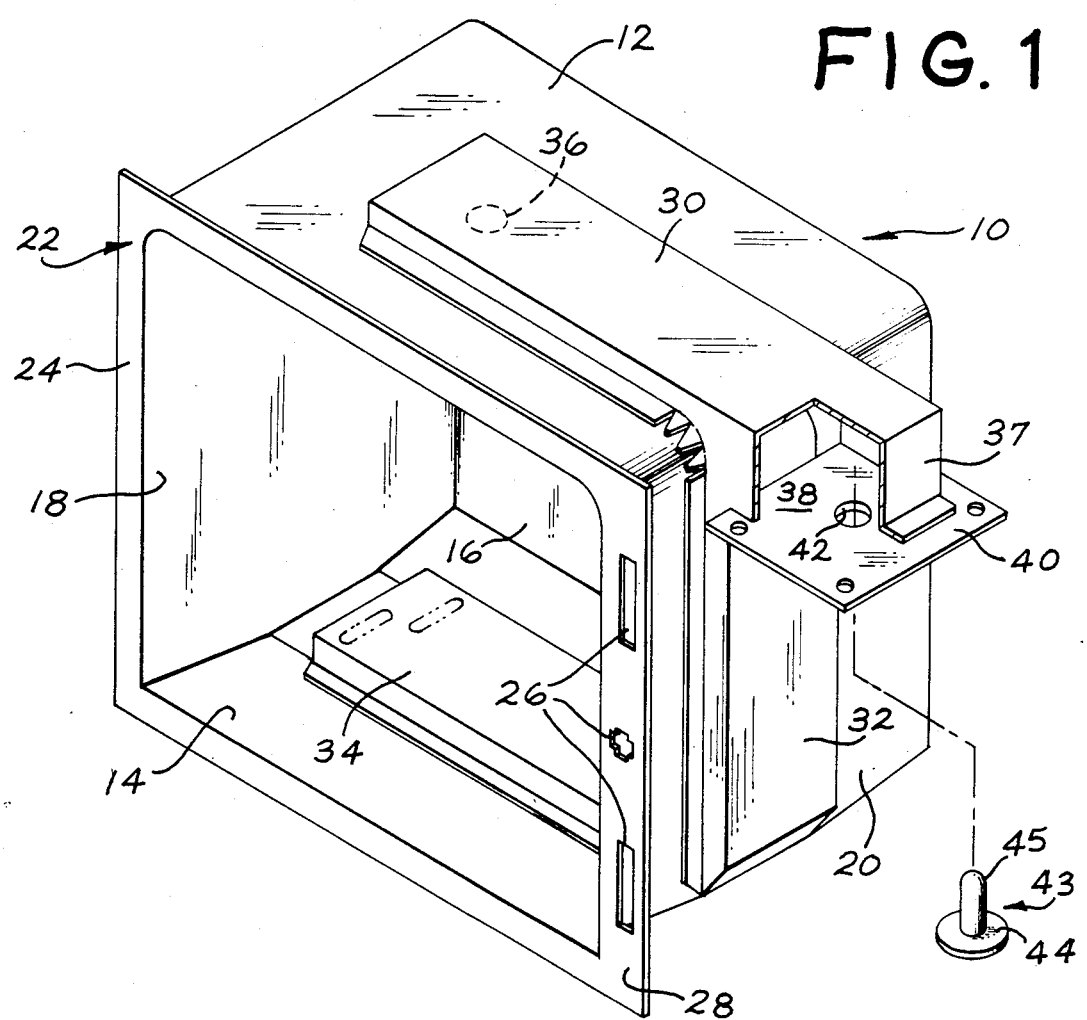
FIG. 1 is a perspective view of a microwave oven cavity typical of the type to be tested by the apparatus and method of the subject invention.

A microwave oven cavity 10 typical of the type to be tested using the apparatus and method of the present invention is illustrated in FIG. 1. Cavity 10 is in the form of a cubic enclosure defined by orthogonally oriented top, bottom, rear and side conductive walls 12, 14, 16, 18 and 20 respectively. The front access opening is circumscribed by a front wall portion or door frame 22 which includes a generally flat wall portion 22 configured like a rectangular picture frame through which access to the cavity may be had. During oven assembly a microwave oven door (not shown) would be hingedly attached to the left hand portion 24 of the door frame and the slots and apertures 26 formed on the right hand portion 28 of the door frame are for receiving latching devices mounted to the door (not shown) for securing closure of the door. A waveguide for coupling microwave energy to the cavity includes horizontally extending top feed branch or section 30, a vertically oriented side branch or section 32 and a bottom feed branch or section 34 which extends across the bottom of the cavity 10. Each of the various waveguide sections are attached to an adjacent portion of cavity wall by welding. Upper waveguide branch 30 includes an aperture 36 formed in the top cavity wall to receive an antenna probe (not shown) for coupling energy from upper waveguide 30 to the interior of cavity 10 via an antenna (not shown). Proximate the intersection of the upper and side waveguides 30 and 32 there is formed an enclosure 37 which provides a launching area 38 for microwave energy. Magnetron mounting plate 40 defines the floor of launch area 38. Microwave energy is provided in a completely assembled oven by a magnetron (not shown) mounted to plate 40 with a magnetron radiating probe extending upwardly through aperture 42 formed in plate 40 for this purpose into the launching area 38. As can be seen in FIG. 1 numerous welds are required to attach the various waveguide sections to the cavity side walls as well as in the formation of the cavity itself. Flaws or defects in any of these welds could permit a microwave energy leakage in excess of permissible and acceptable levels. A more detailed description of cavity 10 is disclosed in commonly assigned co-pending U.S. patent application Ser. No. 363,705 filed Mar. 30, 1982, by Dills et al, which is hereby incorporated by reference. It will be appreciated that while for the cavity herein described the joints are formed by welding, the test apparatus and method of the present invention are applicable for detecting leakage for cavities joined by metal crimping or other fabrication processes as well.

As briefly mentioned hereinbefore a primary objective of the apparatus and method of the present invention is to permit the testing of cavities after fabrication of the cavities and waveguide portions but prior to painting the cavity and further assembly of the additional oven components.

Figure 2:
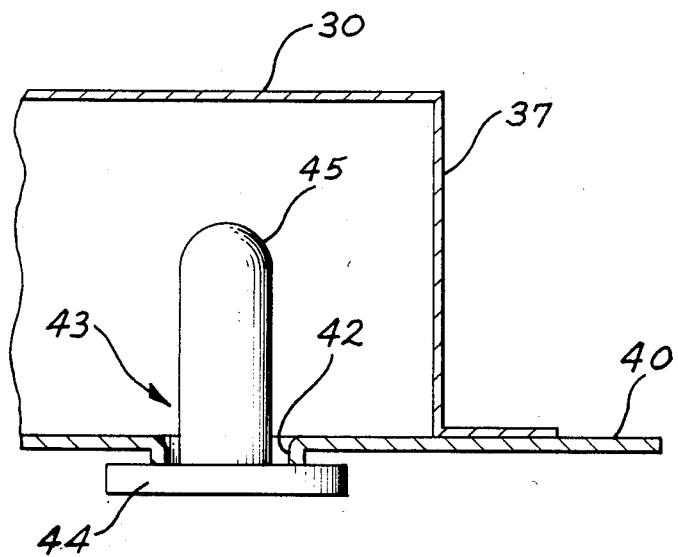
FIG. 2 is an enlarged sectional view of the waveguide launcher portion of the oven cavity of FIG. 1 showing details of the magnetron mounting bracket and the plug employed to block the magnetron probe opening when the cavity is tested in accordance with the present invention.

Apparatus for testing of the cavity of FIG. 1 in accordance with the present invention will now be described in greater detail with reference to FIGS. 2–7. Normally in a fully assembled oven, magnetron probe aperture 42 in support plate 40 would be plugged by the oven magnetron probe. In order to prevent leakage of microwave energy from the cavity interior during testing, a plug designated generally 43 is inserted into aperture 42 as best seen in FIGS. 1 and 2. Plug 43 comprises a generally circular magnetized disc 44 of greater diameter than aperture 42, and a probe member 45 projecting from the center of disc 44. When in position, probe 45 extends through aperture 42 into launching area 38. The plug is secured in this position by the magnetic attraction of disc 44 to plate 40.

In addition to preventing leakage, plug 43 also tends to balance the field supported in the waveguide sections. The depth of penetration of probe 45 into launch area 38 is empirically selected to provide the desired balance. In the illustrative embodiment a probe length of 9/16 inches provided satisfactory results.

Figures 3, 4:
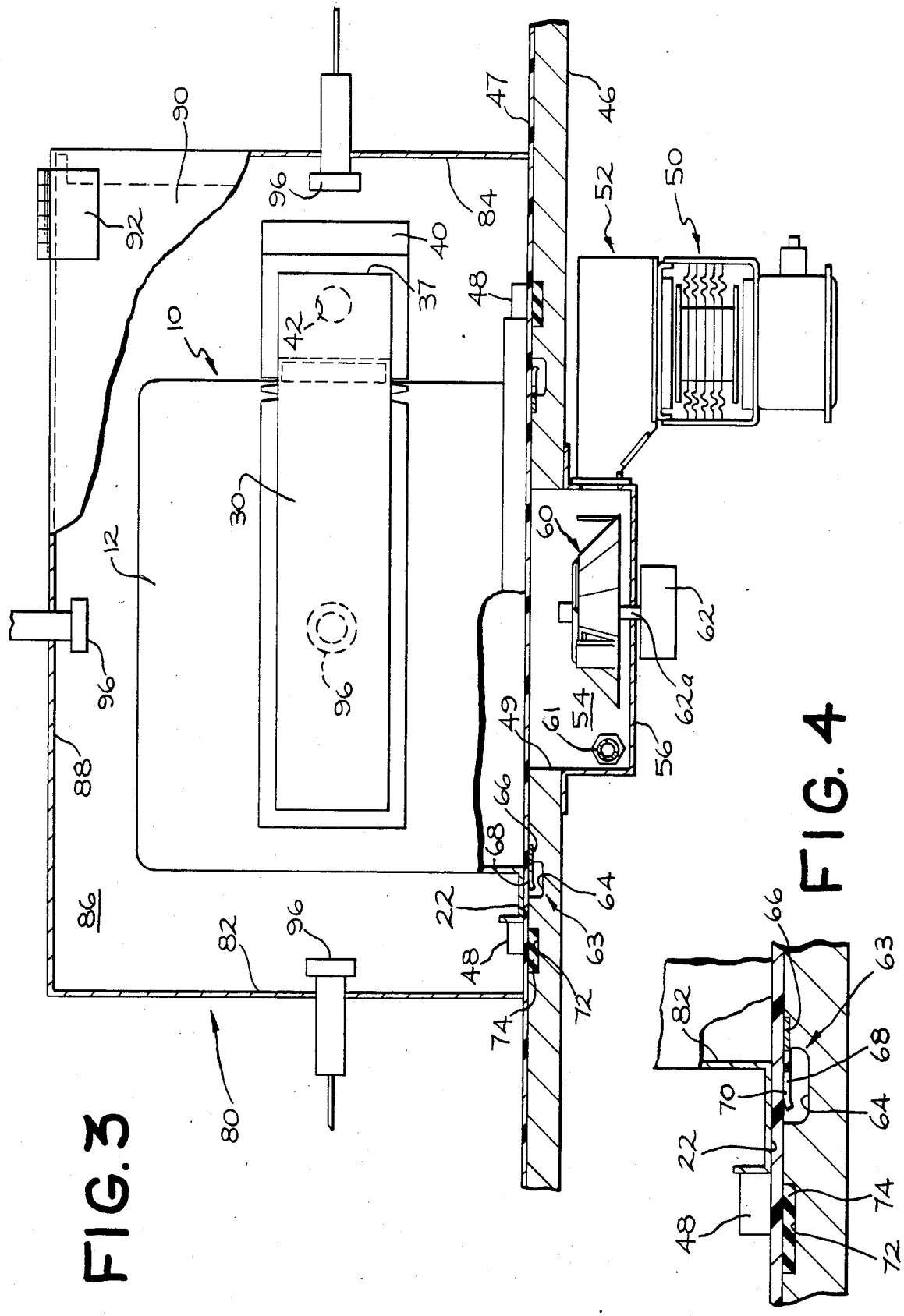
FIG. 3 is a plan view in highly schematic form of the cavity of FIG. 1 in position to be tested by apparatus in accordance with the present invention.
FIG. 4 is an enlarged partial front sectional view of the choke filter portion of the test apparatus of FIG. 2.
Figure 7:
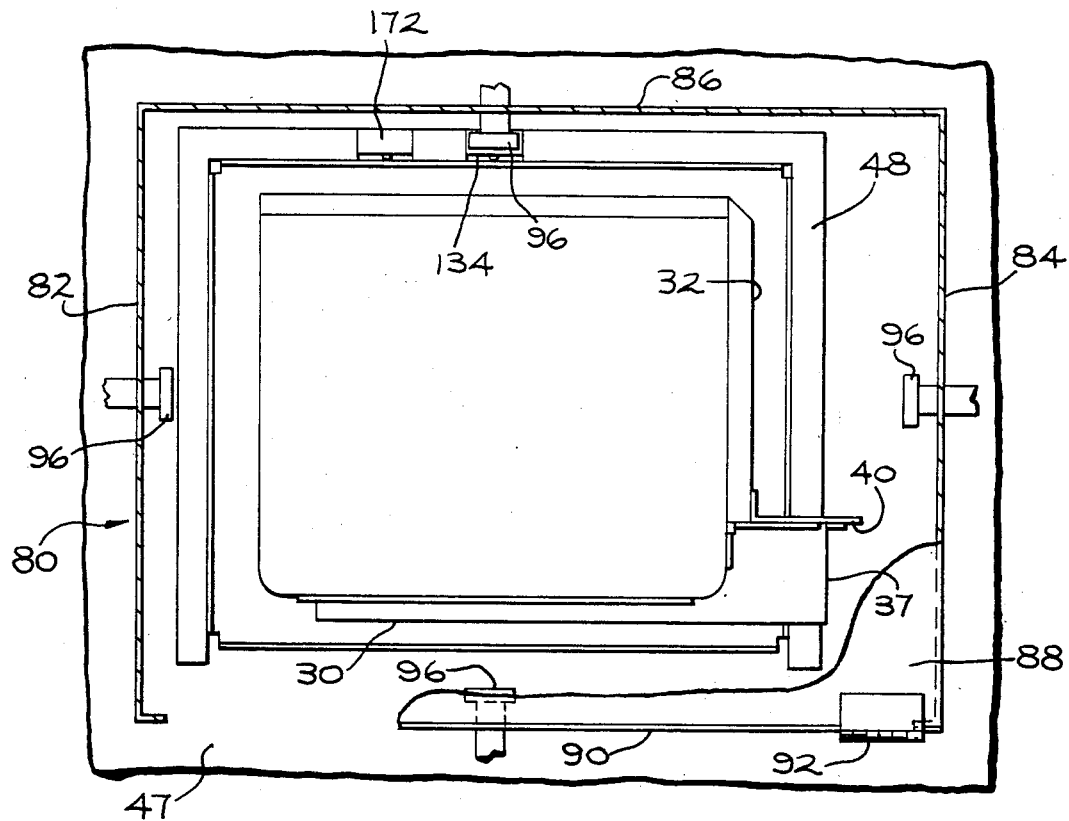
FIG. 7 is a top view of an illustrative embodiment of the test apparatus of the present invention with the cavity in its test position and having portions removed to illustrate certain details thereof.

FIG. 3 shows test apparatus illustratively embodying the invention with the cavity of FIG. 1 in position for testing. Cavity 10 is supported in its test position from a generally planar conductive test plate 46 which may be fabricated from steel or aluminum or other conductive materials. A wear surface 47 comprising a plastic low loss dielectric sheet material is placed over test plate 46 to facilitate sliding of cavities into position for testing without undue wear on the test plate surface or the cavity frame. A generally U-shaped guide rail or barrier 48 defines the cavity test position on the test plate. As best seen in FIG. 7 when in the test position the outer edge of the cavity front wall 22 abuts barrier 48 on three sides so as to laterally position cavity 10 for testing. In the test position the access opening for cavity 10 faces test plate 46 overlaying a generally square aperture 49 formed through test plate 46. A pair of position detecting limit switches 134 and 172 are mounted in recesses in the crossing portion of barrier 48 with switch actuators projecting forward as seen in FIG. 5, to actuate when a cavity is properly positioned for testing.

A microwave generating means in the form of a magnetron 50 is mounted beneath test plate 46. Microwave energy from magnetron 50 is coupled to the interior of cavity 10 via a standard WD340 waveguide 52 which couples energy from magnetron 50 to a sub-cavity 54. Sub-cavity 54 comprises a generally rectangular box-like metallic structure 56 formed beneath aperture 49 and attached by suitable means to the lower surface of test plate 46. A rotating field displacer 60 is rotatably mounted in sub-cavity 54 to provide polarization in varying and alternating planes for the electromagnetic fields supported in cavity 10, resulting from the discontinuity presented by the field displacer as its rotates. A water load is provided by circulating water through a glass cylinder 61 in sub-cavity 54 to provide a light load to keep magnetron 50 within specified operating limits. Means for rotating field displacer 60 is provided in the form of a electric motor 62 mounted directly beneath the sub-cavity 54 with the motor drive shaft 62a projecting upwardly with the interior of sub-cavity 54 to rotatably support field displacer 60.

A good microwave seal between the cavity under test and the test plate is necessary in order to keep the signal to noise ratio of the entire test system to a value where leakage from a single weld can easily be discriminated.

Figure 5:
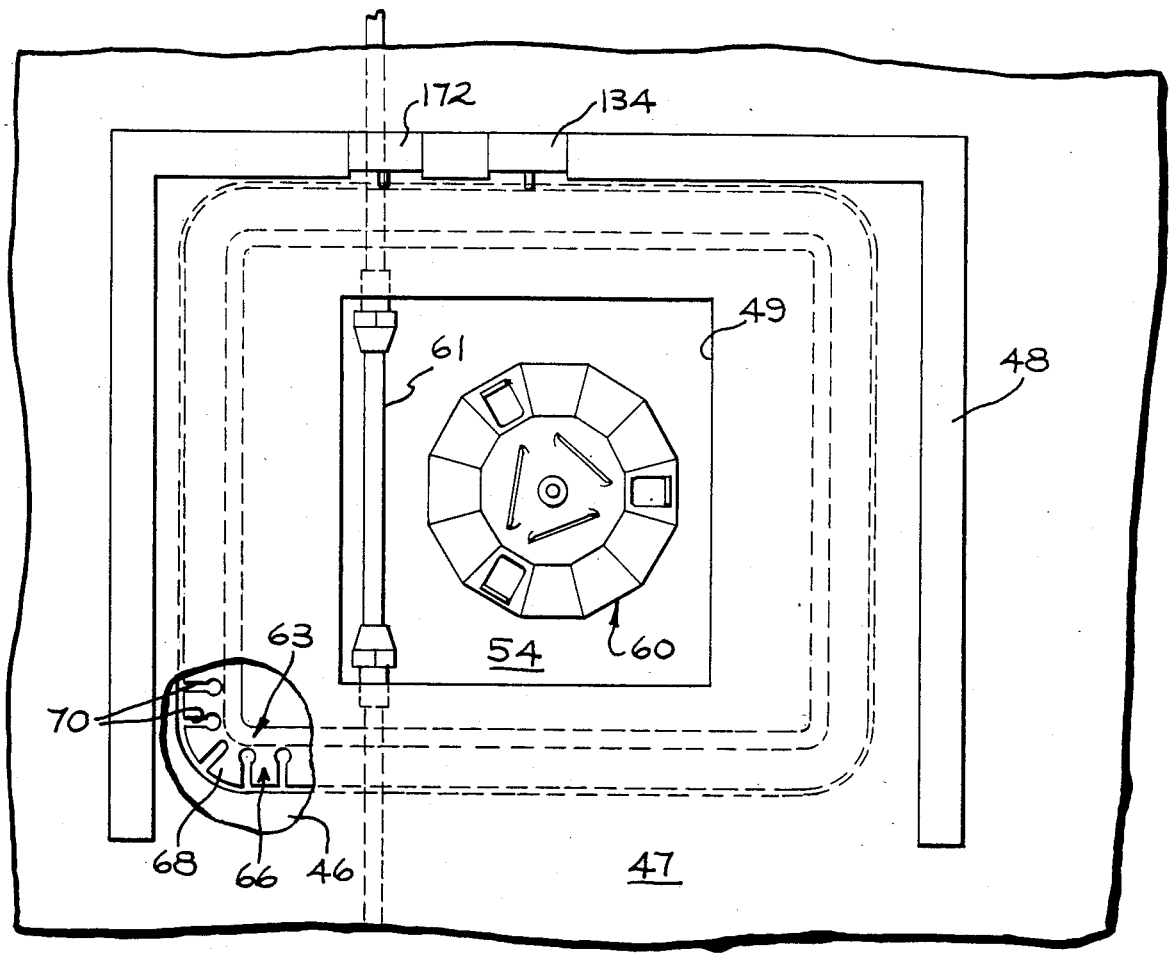
FIG. 5 is a top view of test apparatus with the cavity removed illustratively embodying the apparatus of the present invention.
Figure 6:
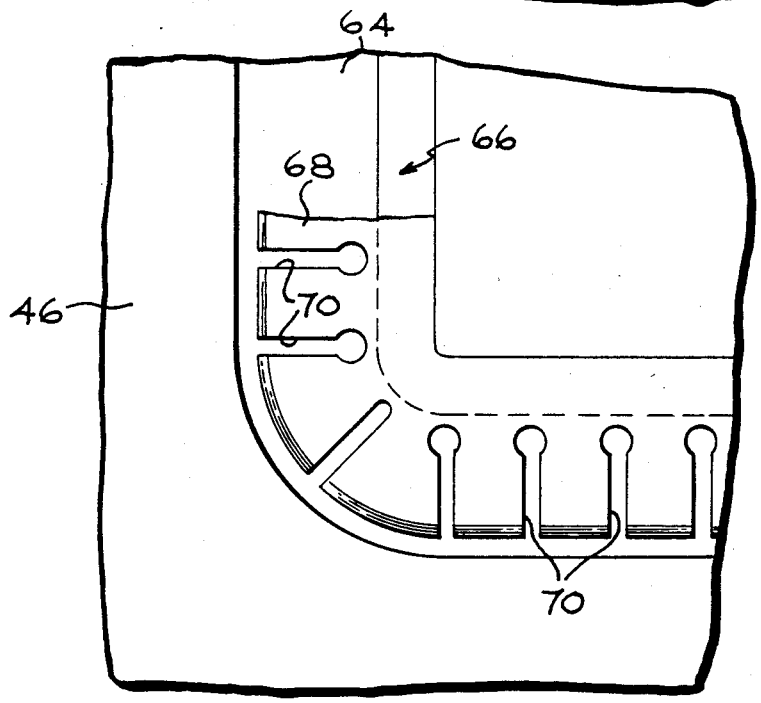
FIG. 6 is an enlarged view of a corner portion of the apparatus of FIG. 3 illustrating the choke filter structure.

To this end, as best seen in FIGS. 3, 4 and 5 a quarter wave choke designated generally 63 terminated by a heavy loading of ferrite rubber is provided on test plate 46 extending about the periphery of the cavity test position. Choke 63 comprises a channel 64 formed in the surface of test plate 46 and extending about the periphery of of the cavity test position such that with a cavity positioned in its test position as shown in FIG. 1 channel 64 forms a closed loop juxtaposed to the door frame portion 22 of the cavity. A thin conductive rectangular choke plate 66 is suitably secured to the test plate inwardly of channel 64. Choke plate 66 includes a section 68 which overlays a portion of channel 64. Plate 66 is of picture frame configuration with its central rectangular opening overlaying aperture 48 in test plate 46 for accommodating sub-cavity 54. Section 68 of choke plate 66 which overlays the channel is provided with slots 70 to prevent current flow along the longitudinal periphery of plate 66 in a direction substantially perpendicular to the extent of the slots.

A second channel 72 is formed outwardly of and generally parallel to choke channel 64. A strip of ferrite rubber 74 is disposed in this channel to absorb residual microwave energy passing beyond the choke. Channel 64 and the conductive choke plate 66 cooperate with door frame portion 22 to form a choke type seal along the entire circumference of the access opening so as to prevent microwave energy from leaking from the cooking cavity through gap between the door frame portion of the cavity and the test plate. The overall operation of such a choke is well-known in the prior art. A description of the operation of such a choke may be found in commonly assigned U.S. Pat. No. 4,313,044 to James E. Staats, which patent is hereby incorporated by reference.

To contain any leakage radiation from cavity 10 during testing, a box-like enclosure 80 shieldably encloses cavity 10 in its test position on test plate 46. Shielding enclosure 80 captures any microwave energy resulting from a re-radiating weld defect or other cavity flaw. Enclosure 80 comprises conductive side walls 82 and 84, rear wall 86, top wall 88 and front wall 90. Test plate 46 provides the bottom wall of the enclosure. In the illustrative embodiment the front wall 90 is hinged securely to top wall 88 via a pair of hinges 92 (only one of which is shown), so as to open outwardly and upwardly to permit access to the interior of the enclosure for insertion and removal of the cavity to be tested. It is to be understood however that a vertically sliding door or a pair of sliding doors on opposing sides could be used to facilitate automated insertion and removal procedures in the production line.

As best seen in FIGS. 3 and 7 a leakage sensor 96 is centrally mounted in each of walls 82, 84, 86, 88 and 90 of enclosure 80 for sensing the power density of microwave energy leaking from the interior of the cavity into that region of the enclosure interior external to the cavity under test. Sensors 96 are isotropic detectors of the type readily commercially available from Holaday Industries, identified as Model No. ES140. In the illustrative embodiment a total of 5 probes are used, each projecting through an aperture formed near the center of each of the side, top, rear, and front walls of enclosure 80. Since generally the sensor nearest the flaw will register the highest power density reading, this sensor arrangement provides positional information for locating the cavity flaws resulting in microwave leakage. Additional probes could be employed to more accurately isolate the location of the defective weld or flaw in the cavity if desired.

Each of sensors 96 are capable of detecting microwave power densities as small as 0.01 milliwatts per square centimeter.

Figure 8:
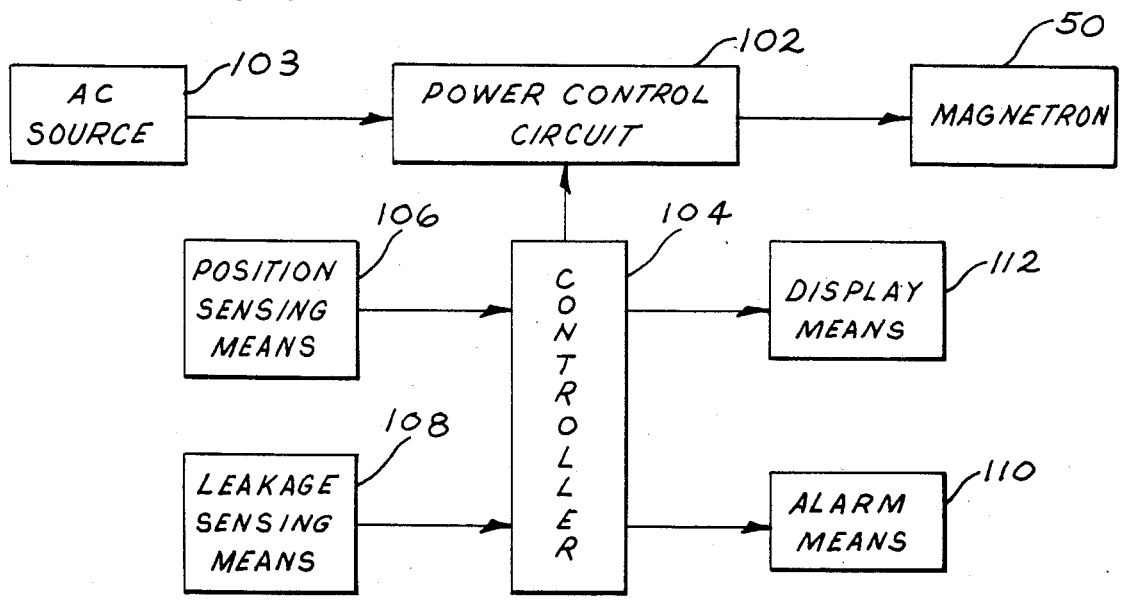
FIG. 8 is a functional block diagram of the control arrangement for the apparatus of FIG. 2.

The control system for the test apparatus will now be described with reference to the functional block diagrams of FIGS. 8 and 9 and the schematic circuit diagram of FIG. 10. The output power of magnetron 50 which energizes the cavity during testing is varied by power control circuitry 102 coupling magnetron 50 to a standard AC power supply 103. Power control circuitry 102 controls the output power of magnetron 50 in response to control signals from a controller 104. Controller 104 is responsive to cavity position sensing means 106 which provides an input to controller 104 signifying that a cavity is properly positioned for testing and to microwave leakage sensing means 108 which informs the controller of the power density level sensed by the various sensors 96 during the test process.

In addition to controlling power control circuit 102, controller 104 also controls energization of an alarm means 110 used to provide a user discernible signal indicative of detected leakage levels in excess of a predetermined reference level and display means 112 which provides a readout of the microwave leakage level detected by each sensor 96 derived from the sensing means.

Figure 9:
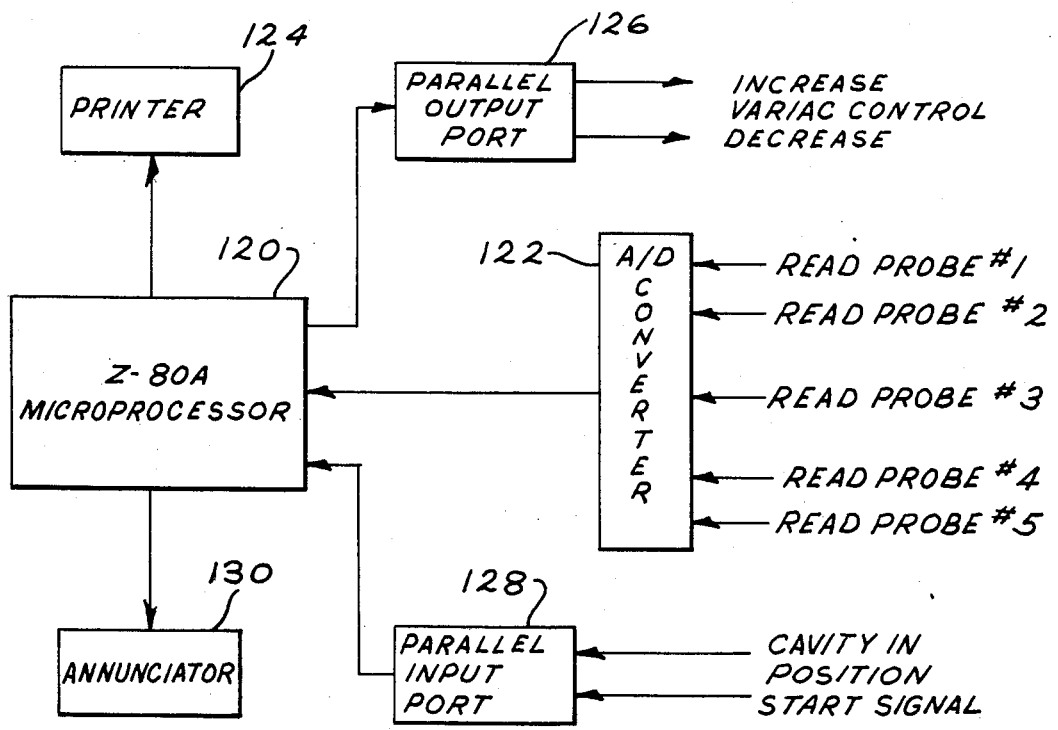
FIG. 9 is a more detailed highly schematic diagram of the controller of the diagram of FIG. 8.

Controller 104 of the illustrative embodiment is shown in greater detail in FIG. 9. The main control element of the controller is a Z-80A microprocessor 120 programmed to perform the test routines to be hereinafter described in greater detail.

Output signals from each of the sensor probes 96 are coupled to microprocessor 120 via a standard analog to digital (A/D) converter 122 which reads the inputs from the probes 96 sequentially. The input signal from A/D converter 122 is input to microprocessor 120. Microprocessor 120 generates output signals to display means comprising printer 124 to provide the user with a hard copy readout or display of the power density reading obtained for each of probes 96. Parallel input port 128 couples the signal from the cavity position sensing means 106 and a start signal provided by the user from an ON/OFF switch 132 (FIG. 10). The cavity position signal is derived from a normally open limit switch 134 (FIG. 5, FIG. 10) laterally centrally located on the back portion of barrier 46 of the positioning arrangement on test plate 46 (FIG. 3). Limit switch 134 is closed when the cavity has been properly oriented in its test position. As best seen in FIG. 7 when the cavity is in the test position, an edge of cavity front wall 122 depressingly engages the actuator 135 of switch 134. Switch 134 is a double pole switch with one set of contacts 134(a) connecting to power line L and a second set of contacts 134(b) coupled to input port 128 to provide a signal to microprocessor 120 indicative of the state of switch 134. The closed state of switch 134 signifies that the cavity is in proper position for testing to begin.

In order to insure the safety of the operator of the test apparatus and maintain leakages resulting from an extremely poorly welded cavity or highly flawed cavity to a level of exposure not greater than that allowed by BHR requirements, proportional voltage control is employed rather than phase control or duty cycle control of the type typically employed in a oven during normal cooking operations. This approach allows the actual output power of the magnetron to be gradually increased rather than merely the average power as in the case of duty cycle control for example. To this end the microprocessor provides power control signals via the parallel output port 126 to either increase or to decrease the voltage applied to the magnetron via a variac device 138 (FIG. 10).

Upon receipt of the input signals from the various detector probes microprocessor 120 compares each signal to a predetermined reference corresponding to the maximum acceptable leakage level. In the event a probe signal signifies a power density level greater than the reference level an alarm signal is generated in the illustrative embodiment by annunciator 130 which provides a user discernible audible signal. It will be appreciated that a visible signal such as by an LED display could be easily employed instead of, or in addition to the audible signal.

Microprocessor 120 in the illustrative embodiment is a standard Z-80A microprocessor readily commercially available from INTEL. Each of the parallel input or output ports 128 and 126 is a standard interface circuit for the Z-80A, also readily commercially available and identifiable by the part number LS373. Printer 124 is a standard printer for the Z-80A. Annunciator 130 likewise comprises a conventional annunciator circuit. It will be appreciated that other integrated circuit devices could be similarly employed.

Figure 10:
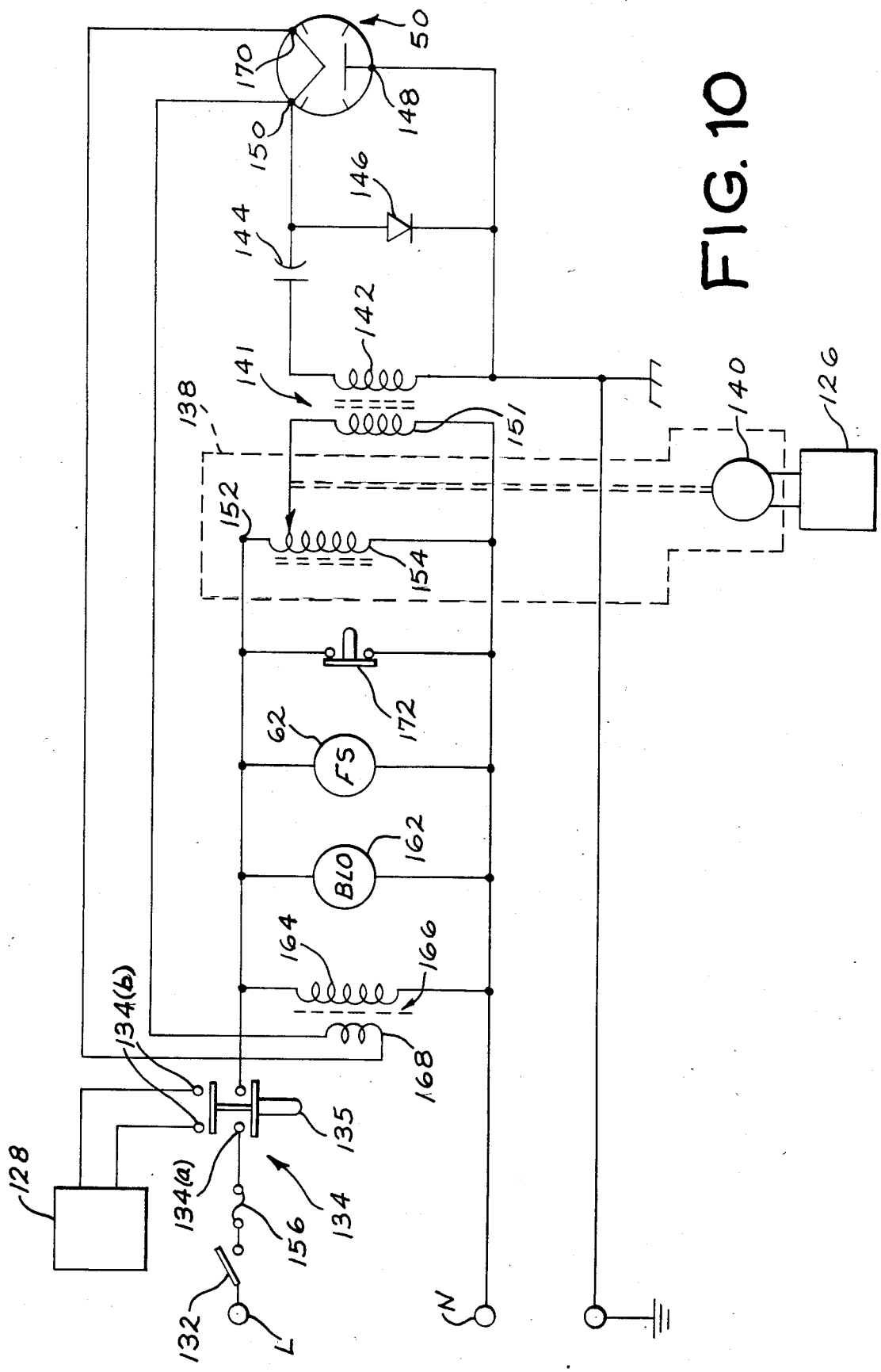
FIG. 10 is a schematic diagram of the power control portion of FIG. 8.

Referring now to FIG. 10 there is shown a simplified wiring diagram of the circuit for controlling the power to magnetron 50 for the test apparatus of the present invention. The illustrated circuit is adapted to be connected between power line L and neutral power line N of a standard 120 volt 60 Hz AC power supply. The circuit includes magnetron 50 which generates microwave energy at the nominal frequency of 2450 megahertz when energized from a suitable high voltage DC source. The magnetron power supply includes a power transformer 141 having a high voltage secondary winding 142 connected to energize magnetron 50 through a half wave voltage doubler circuit comprising a series capacitor 144 and a rectifying diode 146 connected across magnetron anode and cathode terminals 148 and 150 respectively and oppositely poled with respect thereto.

Power line L is coupled to terminal 152 of primary coil 154 of variac device 138 through a fuse 156 and position limit switch 134. Fuse 156 functions to protect the entire circuit against electrical overcurrent. Position switch 134 hereinbefore described prevents operation of magnetron 50 in the event the cavity is not in its proper test position on test plate 46. ON/OFF switch 132 operates to control the operation of magnetron 50 in response to the manual actuation of the start button or switch (not shown). The primary winding 151 of power transformer 140 is connected across the output of variac device 138.

Variac device 138 including its servo motor 140, is readily commercially available from the Superior Electric Company, Bristol, Conn., identifiable as a Series 116 BU POWERSTAT® variable transformer. The servo motor for the variac device is driven in a clockwise or counterclockwise direction to increase or decrease the output voltage applied to the primary of power transformer respectively by appropriate signals from microprocessor via parallel output port 126. Additionally connected across the L and N power source terminals are a group of loads 62, 162 and 164 which are continuously energized during operation of magnetron 50. Loads 162 and 62 consist of a blower motor and field displacer drive motor which are used to cool the magnetron and rotate the hereinbefore described field displacer 60 respectively. Load 164 comprises the primary 166 of filament transformer 164 which heats the cathode of the magnetron tube. The secondary 168 of transformer 164 is connected across magnetron terminals 150 and 170 for this purpose. As a fail-safe mechanism to insure the circuit does not operate magnetron 50 with no cavity in position for testing, a crowbar circuit comprising a second limit switch 172 is connected directly across lines L1 and N. Switch 172 is a normally closed switch positioned approximate the rear guidebar of the test plate shown in FIGS. 2 and 3. When no cavity is present in the test position, switch 172 is closed. In the event the position switch 134 should fail in the closed position switch 172 when closed will rapidly cause sufficient current to blow fuse 156 feeding primary current to the variac.

Figure 11:
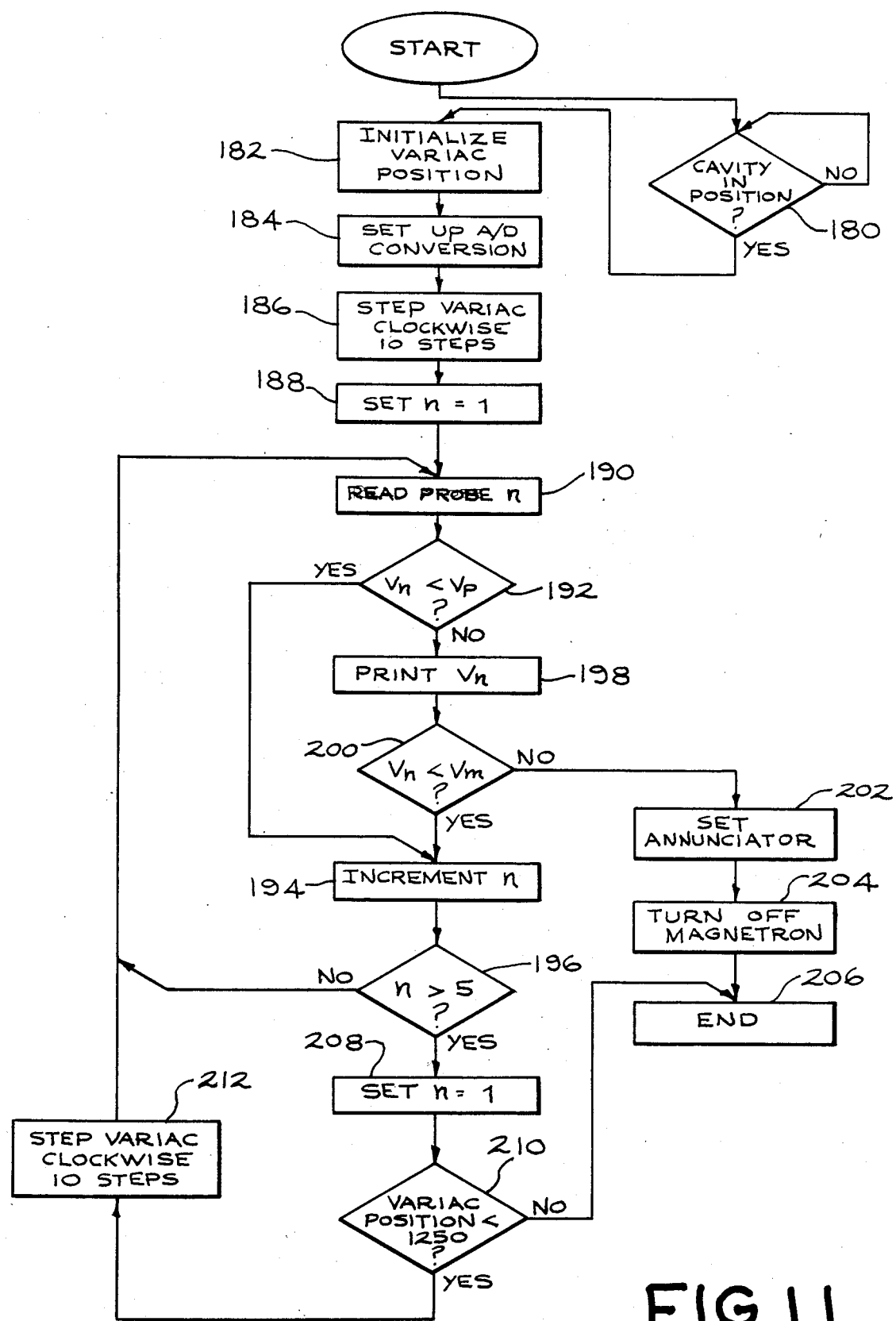
FIG. 11 is a flow diagram of the control routine incorporated in the microprocessor of FIG. 9 for controlling operation of the test apparatus.

Microprocessor 120 is programmed to perform control functions for the test apparatus to implement the test method in accordance with the present invention. FIG. 11 is a flow diagram which illustrates the control routine incorporated in the microprocessor for this purpose. From this diagram one of ordinary skill in the programming art can prepare an appropriate set of instructions for the microprocessor.

The control program implemented by microprocessor 120 first determines if the cavity to be tested is in the proper test position by scanning the input from input port 128 to determine the state of position switch 134. Upon determining that the position switch is closed, the variac motor is then raised in its starting position, which position is selected to operate the magnetron at a voltage level just below the so-called "hartree" point so that no magnetron current is flowing. The test sequence involves sequentially polling the outputs of each of the five probes 96, at each of a plurality of discrete magnetron output power levels and comparing the input from each probe to a first reference value to determine whether the detected leakage level is sufficient to provide a meaningful output from the probe. If so the output is printed and the reading is next compared to a maximum reference level indicative of leakage in excess of a predetermined minimum level which satisfies BRH standards. If the detected leakage level exceeds this second reference an annunciator is energized and the magnetron is de-energized and the program stops.

The power density reference level for printing is set at 0.05 milliwatts per square centimeter. This reference is utilized in recognition of the fact that power readings below a certain level do not contain sufficient accuracy to be meaningful and hence there is no point in having those values printed. It is understood, of course, that this reference level is selected somewhat arbitrarily. Other references could be utilized and all values could be printed if so desired. The maximum reference or reject level is set at 0.1 milliwatts per square centimeter. This level is selected to insure that microwave ovens passing this test will meet the BRH leakage requirements with considerable margin of safety. As the case with the print reference, this level is somewhat arbitrary and other reference levels could be similarily employed.

If after sequentially polling all five probes none exceed the maximum reference, the output of the voltage of the variac is increased by a predetermined increment thereby increasing magnetron output power of the magnetron to the next test power level and the steps are repeated. The output power of the magnetron is incrementally increased in this fashion over a range of discrete power levels from zero to 750 watts.

Referring now to the flow diagram of FIG. 11, inquiry 180 determines if the cavity is in position. If not, the program loops until this condition is corrected. Upon detecting a cavity in proper position for testing the variac is initialized to position step 450 (Block 182) which places the voltage applied to magnetron 50 at a point just below the "hartree" point. The A/D circuit is set up (Block 184); variac 138 is incremented in a clockwise direction 10 steps (Block 186) thereby raising the voltage applied to magnetron 50 to an initial level just above the hartree point. Indexing variable n, employed to facilitate sequentially polling the five leakage detection probes 96, is initialized to one (Block 188). The probe corresponding to the current value of the index n is read (Block 190), the input received from probe n, Vn is compared to a first reference Vp (Inquiry 192) to determine whether or not the value should be printed. If Vn is less than Vp, the program branches to Block 194 where the index is incremented. Inquiry 196 determines whether N is greater than 5 signifying all probes have been read. If not, program returns to Block 190 to repeat the sequence for the input from the next probe.

Returning again to Inquiry 192, if Vn is not less than Vp, the Vn is printed (Block 198) and Vn is compared to the maximum reference Vm (Inquiry 200). If the Vn is not less than Vm, an annunciator is triggered (Block 202), magnetron 50 is turned off (Block 204) and the program ends (Block 206). If Vn is less than Vm, the index n is incremented (Block 194), and Inquiry 196 determines whether all five probes have been read. If not, the loop is repeated by branching back to block 190. If all five probes have been read, the index n is reset to 1 (Block 208). Inquiry 210 determines whether the stepping motor has reached its maximum position of 1250. If it has, the program ends (Block 206). If it has not, the variac is increased counterclockwise 10 steps (Block 212) to raise the voltage and hence the magnetron output power to the next incremental level and the program returns to repeat the readings of the probes. Hence, the output voltage is increased in increments of 10 steps from step position 450 to step position 1250. This involves 80 passes through the loop. The printout provided by this routine can provide the user with information on the leakage detected by each probe at each power levels from minimum power to maximum power that power level at which excessive leakage is detected. In the event a flaw is detected the readout indicates to the reader at what power level this flaw was detected and which sensor picked up the maximum reading at that point.

While a specific embodiment has been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. Apparatus for production line microwave leakage testing of a microwave oven cavity of the type having one wall defining an access opening for the cavity, said apparatus comprising:

a generally planar conductive test plate defining on one surface thereof a test position for supporting a microwave oven cavity to be leakage tested, said plate having an aperture formed therein, said cavity when positioned in said test position having its access opening facing said plate, overlaying said aperture with said one wall in microwave sealing engagement with said plate;

means for generating microwave energy;

means for coupling microwave energy from said generating means into the interior of said cooking cavity through said aperture and said access opening;

an enclosure comprising conductive walls for shieldably enclosing a cavity when in said test position on said plate;

microwave leakage detection means strategically disposed to detect the power density of microwave energy in the region between the cavity and the enclosure walls;

means responsive to said detection means operative to generate a user discernible signal upon detection of microwave power density greater than a predetermined reference level thereby alerting the user to the presence of flaws in the cavity permitting microwave leakage in excess of an acceptable level.

2. Apparatus in accordance with claim 1 further comprising choke seal means disposed on said test plate extending about the periphery of the access opening of the cavity when in said test position for minimizing microwave leakage between said cavity and said test plate.

3. The apparatus in accordance with claim 1 further comprising means for sensing when a cavity is positioned in said test position, and wherein said control means is responsive to said position sensing means and operative to enable energization of said microwave generating means when said sensing means detects a cavity in said test position.

4. Apparatus in accordance with claim 1 further comprising display means responsive to said control means and operative to display the leakage level detected by said detection means.

5. Apparatus in accordance with claim 4 wherein said display means comprises printing means operative to provide a hard copy display of the detected leakage level.

6. Apparatus in accordance with claim 2 further comprising a generally planar microwave pervious wear surface overlaying said test plate to facilitate sliding of a cavity into its test position.

7. Apparatus in accordance with claim 1 wherein said enclosure comprises a box-like structure including four side walls, a top wall and a bottom facing opening enclosed by said test plate and wherein said leakage detecting means comprises a plurality of microwave power density measuring devices supported from said enclosure walls.

8. Apparatus in accordance with claim 7 wherein one of said plurality of measuring devices is centrally mounted to each of at least two opposing enclosure side walls.

9. Apparatus in accordance with claim 7 wherein at least one of said plurality of measuring devices is generally centrally mounted to each of said enclosure side and top walls.

10. Apparatus in accordance with claim 9 wherein said control means includes means for sequentially polling said measuring devices;

said apparatus further comprising display means for displaying the power density level sensed by each of said measuring devices thereby enabling the user to determine which device detected the highest power density level, and therefore is likely the closest to the location of the flaw permitting the leak.

11. Apparatus in accordance with claim 10 wherein said control means further comprise means for varying the output power of said microwave generating means over a range of discrete power levels and wherein said display means comprises printing means operative to provide a hard copy display of the detected leakage level of each measuring device at various power levels.

12. A method of production line testing a microwave oven cavity for microwave leakage comprising the steps of:
placing the cavity on a test plate with the cavity access opening facing an aperture in the test plate;
coupling microwave energy from a microwave energy generator through the aperture and access opening into the cavity;
monitoring microwave radiation levels external to the cavity proximate one or more walls thereof;
generating a user discernable signal upon detection of microwave radiation levels external of said cavity greater than a predetermined reference level.

13. A method of production line testing a microwave oven cavity for microwave leakage comprising the steps of:
placing the cavity on a test plate with the cavity wall defining a cavity access opening in microwave sealing engagement with the test plate and the access opening facing an aperture in the test plate;
enclosing the cavity with a microwave impervious conductive enclosure;
coupling microwave energy from a microwave energy generator through the aperture and access opening into the cavity;
monitoring the microwave radiation levels in the region of the enclosure external of the cavity;
generating a user discernable signal upon detection of a radiation level in this region greater than a predetermined reference level corresponding indicative of leakage radiation greater than the maximum acceptable leakage level.

14. A method in accordance with claim 13 wherein the step of coupling microwave energy into the cavity includes step-wise increasing the output power of the microwave generator through a plurality of predetermined discrete power levels.

15. A method in accordance with claim 14 further including the step of recording the leakage radiation level detected at various output power levels.

16. A method in accordance with claim 15 wherein the step of monitoring the radiation levels in the region of the enclosure external of the cavity, is performed using a power density measuring device disposed proximate each cavity wall, and comprises sequentially polling the output of each measuring device.

17. A method in accordance with claim 16 wherein the step of recording the detected leakage radiation level comprises recording the output of each measuring device at the various output power levels thereby enabling the user, in the cavity a flaw is detected to identify the most likely side of the cavity to contain the flaw.

* * * * *